United States Patent [19]

Sultan et al.

[11] Patent Number: 6,008,099
[45] Date of Patent: Dec. 28, 1999

[54] FABRICATION PROCESS EMPLOYING A SINGLE DOPANT IMPLANT FOR FORMATION OF A DRAIN EXTENSION REGION AND A DRAIN REGION OF AN LDD MOSFET USING ENHANCED LATERAL DIFFUSION

[75] Inventors: Akif Sultan, Santa Clara; Dong-Hyuk Ju, Cupertino, both of Calif.

[73] Assignee: Advanced Micro Devices, Inc., Sunnyvale, Calif.

[21] Appl. No.: 09/050,689

[22] Filed: Mar. 30, 1998

[51] Int. Cl.$^6$ ................................................ H01L 21/336
[52] U.S. Cl. .................... 438/305; 438/290; 438/289; 438/302; 438/301; 438/303; 438/306; 438/307
[58] Field of Search ................................ 438/290, 289, 438/302, 301, 303, 305, 306, 307, 217, 231, 232, 162, 163

[56] References Cited

U.S. PATENT DOCUMENTS 5,360,749  11/1994  Anjum et al. .............................. 437/24
5,470,794  11/1995  Anjum et al. .
5,593,907  1/1997  Anjum et al. .............................. 437/35

OTHER PUBLICATIONS

"An approach using a subamorphizing threshold dose silicon implant of optimal energy to achieve shallower junctions", Akif Sultan and Sanjay Banerlee, Journal of Applied Physics, vol. 83, No. 12, 1998 American Institute of Physics, Jun. 15, 1998, pp. 8046–8050.

*Primary Examiner*—Jey Tsai
*Assistant Examiner*—Neal Berezny
*Attorney, Agent, or Firm*—Amin, Eschweiler & Turocy, LLP

[57] ABSTRACT

A method of making a lightly doped drain transistor includes the steps of forming a gate electrode (52) and a gate oxide (54) over a semiconductor substrate (56) and forming a drain (70) in a drain region (58) and a source (72) in a source region (60) of the substrate (56). The method further includes generating interstitials (62) near a lateral edge of at least one of the drain (70) and the source (72) and thermally treating the substrate (56). The thermal treatment cause the interstitials (62) to enhance a lateral diffusion (84) of the drain (70) under the gate oxide (54) without substantially impacting a vertical diffusion (82) of the drain (70) or the source (72). The enhanced lateral diffusion (84) results in the formation of at least one of a lightly doped drain extension region (75) and a lightly doped source extension region (76) without an increase in a junction depth of the drain (70) or the source (72). The step of generating interstitials (62) may include the step of implanting at least one of the drain region (58) and the source region (60) of the substrate (56) with a large tilt angle implant which creates the interstitials (62) at a location near the gate oxide (54).

18 Claims, 2 Drawing Sheets

FABRICATION PROCESS EMPLOYING A SINGLE DOPANT IMPLANT FOR FORMATION OF A DRAIN EXTENSION REGION AND A DRAIN REGION OF AN LDD MOSFET USING ENHANCED LATERAL DIFFUSION

FIELD OF THE INVENTION

The present invention is generally directed toward integrated circuit manufacturing and is more particularly related to a method of forming a single dopant implant lightly doped drain (SDI-LDD) transistor structure to thereby provide a drain extension region using enhanced lateral diffusion.

BACKGROUND OF THE INVENTION

Transistor devices make up one of the integral components of today's integrated circuits. Consequently, a reduction in the size of transistors (often called "scaling") is constantly being pursued. Prior art FIG. 1 is a fragmentary cross section diagram illustrating a conventional MOS type transistor 10. The transistor 10 consists of a conductive gate region 12 overlying a thin gate oxide 14 which overlies a substrate 16. The gate 12 and the gate oxide 14 are disposed between a drain region 18 and a source region 20 which are formed in the substrate 16 having a channel region 22 located therebetween which underlies the gate 12 and the gate oxide 14.

As the conventional transistor 10 is scaled into the submicron range to reduce its dimensions and thereby improve the transistor packing density on a chip, the transistor 10 begins to experience hot-carrier effects, as illustrated in prior art FIG. 2. These undesirable hot-carrier effects become more evident when the transistor 10 is scaled while maintaining the supply voltage constant or when the supply voltage is not reduced as rapidly as the structural features of the transistor.

The hot-carrier effects are due to an increase in the electrical field within the channel region 22. The increased electric field causes electrons in an inversion layer 26 to be accelerated (or "heated") to an extent that several different undesirable phenomena occur. As illustrated in prior art FIG. 2, the hot-carrier effects can include charge injection, substrate current and electron injection into the gate oxide 14. Perhaps the most crucial hot-carrier effect is the charge injection into the gate oxide 14 which damages the thin oxide and leads to a time-dependent degradation of various transistor characteristics such as the threshold voltage ($V_T$), the linear transconductance ($g_m$) and the saturation current ($I_{DSAT}$).

One prior art solution which reduces the undesired hot-carrier effects of traditional transistor structures is the lightly doped drain (LDD) transistor 30, which is illustrated in prior art FIG. 3. The LDD transistor 30 includes the gate 12 and the gate oxide 14 formed in a conventional manner, wherein a lightly doped drain extension region 32 is formed adjacent to the drain region 18 between the drain region 18 and the channel 22. The lightly doped drain extension region 32 typically reduces the electric field near the channel region 22 by about 30–40 percent and thus the hot-carrier reliability of the transistor is greatly improved. The extension region 32 reduces the electric field by effectively dropping a portion of the drain voltage across the extension region 32.

As transistor designers continue to scale down the transistor device dimensions, the junction depths of the source and drain regions (as well as the lightly doped drain extension region) also need to be reduced (i.e., make the junctions more shallow). Junction depths must be reduced in conjunction with scaling in order to prevent short channel transistor effects such as punchthrough and threshold voltage shift. One conventional approach to reducing the junction depth is to reduce the implant energy used to form the junctions and reduce the diffusion of the junctions in the vertical direction. The source/drain extension regions, however, require ultra-shallow junctions. The shallow p-type junctions needed for the source/drain extension regions of the LDD structure using B or $BF_2$ are especially difficult to fabricate. Boron, being a light ion suffers considerable channeling during the implant and boron diffusion is enhanced in the presence of silicon interstitials during the heat treatment step, resulting in deeper than expected junctions. Thus, fabricating shallow p-type junctions for the source/drain extension regions is a big challenge for process engineers.

The current approach to forming the p-type shallow junctions involved reducing the energy of the implant and subsequently aiming to control the ion channeling during the implant and to minimize the enhanced diffusion during the heat treatment step.

Another disadvantage associated with prior art LDD transistors 30 is that they require an additional mask step in the fabrication process. Although the lightly doped drain extension region 32 is self-aligned to the gate 12, a masking step (not shown) must take place to shield portions of the semiconductor wafer where the lightly doped drain implant is not desired.

It is an object of the present invention to overcome the difficulties facing the prior art by providing a new method for fabrication of source/drain extension regions to obtain ultra shallow p-type junctions. It is also an object of the present invention to simplify the semiconductor manufacturing process by not requiring the LDD mask and thus using one less masking step.

SUMMARY OF THE INVENTION

The present invention relates to a method of fabricating a lightly doped drain transistor structure without performing a separate lightly doped drain implant step. The invention allows for the formation of a lightly doped drain (LDD) transistor structure without an additional LDD mask step and provides for a new method for formation of ultra shallow p-type source/drain extension regions. Thus, ultra shallow p-type source/drain extension region junctions using the present invention facilitate the reduction of the transistor size to take advantage of the increased speed and reduced packing density.

The present invention involves the fabrication of the source/drain extension regions by enhanced lateral diffusion by providing interstitials which enhance boron diffusion of the p+ source/drain implant. In the present invention, the interstitials are provided by a large tilt angle sub-amorphous implant. Thus, instead of trying to minimize enhanced diffusion as in the prior art, the present invention overcomes the limitation by controlling the amount of deliberate enhanced lateral diffusion to create the source/drain extension regions by optimizing the implant parameters of the large tilt angle sub-amorphous implant.

According to one aspect of the present invention the source/drain extension regions are created by enhanced lateral diffusion of the p+ source/drain regions. The large tilt angle implant is a shallow implant and places interstitials near the lateral edge of the drain region and the source region near the gate oxide. The interstitials enhance the lateral diffusion of the drain region and the source region, thereby generating a lightly doped drain extension region and a lightly doped source extension region without substantially affecting the vertical diffusion of the drain region and the source region. Furthermore, the enhanced lateral diffusion of the drain and source regions results in the formation of extension regions between the drain and the channel and the source and the channel, respectively, without performing an additional lightly doped drain (i.e., extension region) implant.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
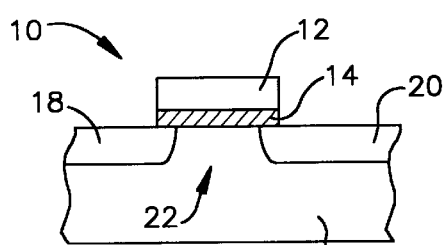
FIG. 1 is a fragmentary cross section diagram of a prior art MOS transistor structure.
Figure 2:
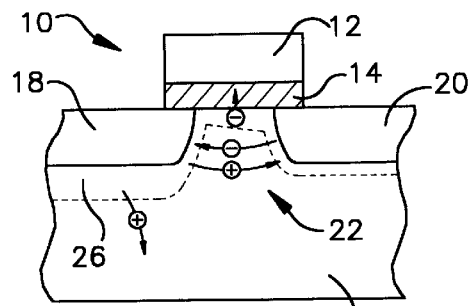
FIG. 2 is a fragmentary cross section diagram illustrating hot-carrier effects associated with a prior art short channel type MOS transistor structure.
Figure 3:
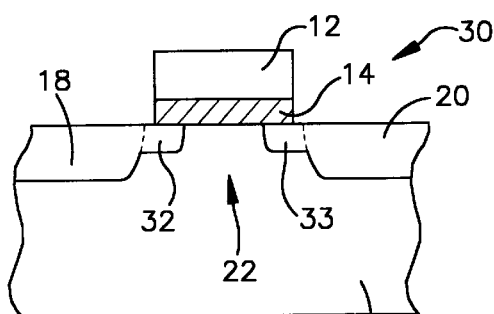
FIG. 3 is a fragmentary cross section diagram illustrating a prior art lightly doped drain MOS transistor structure.

The present invention will now be described with reference to the drawings wherein like reference numerals are used to refer to like elements throughout. One aspect of the present invention relates to a method of forming a lightly doped drain transistor structure without performing a separate extension region implant. The invention eliminates a mask step conventionally associated with an extension region implant by performing a sub-amorphous large tilt angle implant in conjunction with the formation of a drain region and a source region. The sub-amorphous large tilt angle implant is a shallow implant and generates interstitials near the surface of the semiconductor substrate in the drain region and the source region that extend near the lateral edge of the drain region and the source region, respectively. The interstitials near the lateral edge of the drain and source regions enhance the lateral diffusion of the drain and source regions underneath the gate oxide without substantially affecting the vertical diffusion of the drain and source regions. The enhanced lateral diffusion of the drain and source regions results in the formation of a lightly doped drain and lightly doped source extension regions between the drain and the channel and the source and the channel, respectively, without having to perform additional LDD implant. Therefore according to the present invention, a lightly doped drain transistor structure having shallow junctions is formed while eliminating the additional LDD implant and mask step of the prior art.

Figure 4:
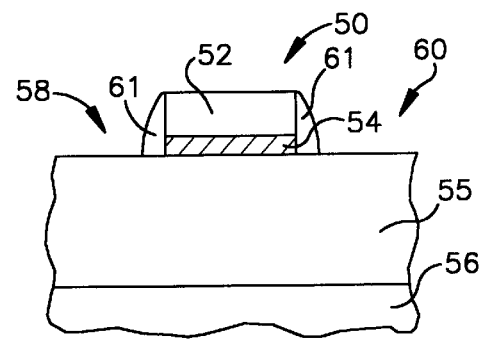
FIG. 4 is a fragmentary cross section diagram illustrating a gate and a gate oxide formed on a semiconductor substrate and having sidewall spacers formed on their lateral edges.

One embodiment of the present invention is illustrated in FIGS. 4–7 as a plurality of semiconductor processing steps. FIG. 4 is a fragmentary cross section diagram illustrating a transistor 50 including a gate 52 overlying a gate oxide 54 which in turn overlies an N-well region 55 in a semiconductor substrate 56. The gate 52 and the gate oxide 54 separate the transistor 50 into a drain region 58 and a source region 60. In addition, a pair of sidewall spacers 61 are formed on the lateral edges of the gate 52 and the gate oxide 54. One exemplary manner in which the transistor 50 is fabricated is described below. Although the present invention is described in accordance with a preferred series of fabrication steps, it should be understood that various manufacturing methods may be utilized and each is contemplated as falling within the scope of the present invention.

The starting material is a single crystal silicon wafer. Typically, the silicon wafer is a lightly doped <100> wafer forming the substrate 56 or a heavily doped <100> wafer with a lightly doped epitaxial layer at the surface. A P-channel transistor is fabricated in the N-doped well 55 within the lightly doped P-substrate 56. The N-well structure 55 is formed in any conventional manner such as by growing a thermal oxide layer, depositing a nitride film via chemical vapor deposition (CVD), applying a mask which generally protects the silicon surface but exposes the desired N-well areas, and implanting ions into the defined N-well area. The N-well ions are driven into the silicon by high temperature cycling to form the N-well region 55 and an oxide layer is then grown over the N-well 55. A $V_T$ threshold-adjust implant is then applied and the surface of the silicon wafer is then stripped of the oxide and nitride/oxide layers and a new oxide/nitride mask layer is formed for fabricating isolation structures (not shown).

The resulting field oxide isolation regions are then grown to define an active device region for the transistor 50. The nitride/oxide mask layer is subsequently removed from the active device region and the gate oxide layer 54 is then grown overlying the N-well 55. A polysilicon gate layer is then deposited, preferably by CVD, and a mask is applied to pattern the polysilicon into the gate structure 52. Although in this embodiment a polysilicon gate material is utilized, it should be understood that the polysilicon material is exemplary and other materials such as metal may also be used in the present invention. After the gate 52 and the gate oxide 54 are formed, the sidewall spacers 61 are created.

To form the sidewall spacers 61, a suitable thickness (about 1,000 to 2,000 Angstroms) of oxide is formed over the transistor 50 via, for example, liquid phase oxide deposition and the oxide sidewall spacers 61 are then formed, preferably by reactive ion etching (RIE), wherein the sidewall spacers 61 are about 0.1 micron thick, as illustrated in FIG. 4. In a preferred embodiment, the sidewall spacers 61 are formed on both sides of the gate 52 and the gate oxide 54, however, in an alternative embodiment, a sidewall spacer may be formed on only one side (e.g., the drain side) of the gate 52 (to thereby form an asymmetric type transistor structure).

Figure 5:
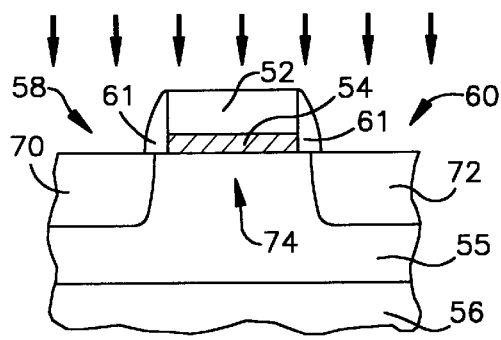
FIG. 5 is a fragmentary cross section diagram illustrating the structure of FIG. 4, wherein a substantially zero degree tilt angle source/drain region implant is performed in a source region and a drain region of the substrate.

After the sidewall spacers 61 are formed, a source/drain ion implantation step is performed to form a drain 70 and a source 72 in the drain region 58 and the source region 60 of the N-well 55, respectively, as illustrated in FIG. 5. The sidewall spacers 61 laterally shift the drain 70 and the source 72 away from the gate 52 and the gate oxide 54 such that the drain 70 and the source 72 do not substantially underlie the gate oxide 54 under which a channel 74 resides.

The source/drain implant is preferably a zero degree tilt angle implant using a P-type dopant (for example, $BF_2$) wherein the implantation dose is about $5 \times 10^{14}$–$5 \times 10^{15}$ ions/$cm^2$ with an implantation energy of about 20–40 keV. In the above manner, the drain 70 and the source 72 are formed as heavily doped P+ regions. In the above manner, the partially completed transistor 50 of FIG. 5 is formed.

Any P-type impurity dopant may be used in the present invention. Common P-type impurity dopants are, for example, boron (B) and $BF_2$. If B is used, because B is a light dopant (in terms of ionic mass) the dopant will not amorphize the surface. Consequently, the subsequent step of performing a large tilt angle implant (which will be discussed in greater detail infra) can be immediately performed. If, however, $BF_2$ (or another heavy impurity dopant) is used for the source/drain implant, amorphization of the drain region is easily achieved using a room temperature implant. In this case, a low temperature pre-anneal step (e.g, at a temperature of about 600° C. for about 15 minutes) is preferably performed after the $BF_2$ implant so solid phase epitaxial regrowth will take place and the amorphous region will regrow. Then the transistor 50 will be properly prepared and ready for the subsequent sub-amorphous large tilt angle implant.

Figure 6:
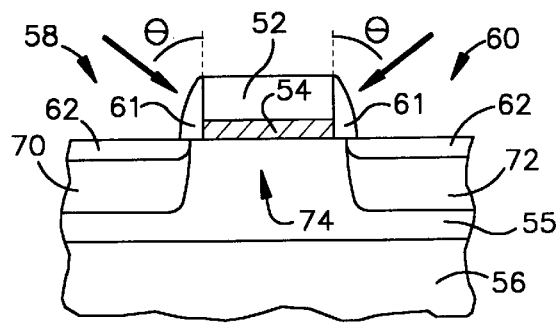
FIG. 6 is a fragmentary cross section diagram illustrating the structure of FIG. 5, wherein a large tilt angle implant is performed in the drain region and the source region of the substrate to form interstitials near the surface of the substrate that extend near a lateral edge of the drain region and the source region.

In a preferred embodiment of the present invention, a sub-amorphous large tilt angle implant is then performed, as illustrated in FIG. 6. The large tilt angle implant is preferably performed at an angle θ of about 30–60° measured from a normal to the surface of the substrate 56. The large tilt angle is performed in both the drain 70 and the source 72. To prevent shadowing, a quad implant is preferred, wherein four implants of equal dose are performed at a wafer rotation angle 90 degrees apart from each other. Thus, if, for example, a 40 degree tilt angle implant is performed it is completed in four steps. First, the 40 degree tilt angle implant is performed at a wafer rotation angle of 0 degrees, followed by three more implants at wafer rotation angles of 90, 180 and 270 degrees, respectively. In addition, the implant is preferably performed with a neutral dopant species such as, for example, silicon or germanium. Alternatively, however, indium may also be used. The goal of the large tilt angle implant is not to form a dopant profile, but rather to generate interstitials (i.e., silicon atoms that have been knocked off their lattice sites) in the regions near the surface of the N-well 55 (hereinafter referred to as the "interstitial regions" 62). Although indium is not a neutral dopant species (it is a P type dopant), it aggressively outdiffuses during a subsequent thermal treatment and therefore does not significantly contribute as an impurity dopant. Therefore indium functions in a manner similar to silicon and germanium and effectively creates interstitials. Although silicon, germanium and indium are disclosed, other neutral species or other dopants may be utilized and are contemplated as falling within the scope of the present invention.

The interstitial regions 62 are shallow due to the large tilt angle utilized for the implant and the selected implant energy (additional details of the implantation energy will be discussed infra). In addition, due to the significant tilt angle θ, the interstitial regions 62 extend beneath the sidewall spacers 61 in the drain region 58 and the source region 60 so that the lateral edges of the interstitial regions 62 and the drain 70 and the source 72 are proximate to one another.

The preferred concentration dose for the large tilt angle implant preferably depends upon the implant species used. The dose may preferably range between 10 to 30 percent of the amorphizing dose at room temperature for the respective species (therefore the large tilt angle is a sub-amorphous implant). For example, a silicon dose of $2 \times 10^{14}$–$6 \times 10^{14}$ ions/$cm^2$ may be used when the silicon amorphizing dose is $2 \times 10^{15}$ ions/$cm^2$ at room temperature. The amorphizing doses at room temperature for germanium and indium are $4 \times 10^{14}$ and $1 \times 10^{14}$ ions/$cm^2$, respectively. The dose range to be used for germanium may be $4 \times 10^{13}$ to $1.2 \times 10^{14}$ ions/$cm^2$ and for indium the dose range may be $1 \times 10^{13}$ to $3 \times 10^3$ ions/$cm^2$. Although the concentration doses highlighted above are preferred depending upon which implant species is utilized, it should be understood that a wide range of doses may be utilized and are contemplated as falling within the scope of the present invention. The energy and dose of the implant for the interstitial regions 62 is sub-amorphous to supply the interstitials at the desired location to enhance lateral diffusion (as will be discussed in greater detail infra).

As stated above, it is desirable for the interstitial regions 62 to be substantially more shallow than the drain 70 and the source 72 so that the interstitials generated by the sub-amorphous large tilt angle implant will not enhance diffusion in the vertical direction during subsequent thermal treatment. The lateral edges of the drain 70 and the source 72, however, substantially coincide with the lateral edge of the interstitial regions 62 so that during subsequent thermal treatment, the interstitials enhance the lateral diffusion of the drain 70 and the source 72 under the gate oxide 54, thereby forming a lightly doped drain extension region 75 and a lightly doped source extension region 76 of the transistor 50.

Since it is desirable to make the interstitial region 62 substantially more shallow than the drain 70, the implantation energy of the large tilt angle implant should be selected to ensure that the interstitials are substantially shallower than the dopant profile of the drain 70 (for example, for a 10 keV boron implant the large tilt angle silicon implantation energy may be 25 keV). Since the concentration doses and implantation energies of both implant steps (the large tilt angle implant and the source/drain implant) may be varied over a wide range, the above preferred embodiment is merely exemplary and it should be understood that any optimized combination of concentration doses and energies that result in the interstitial regions 62 being substantially shallower than the drain 70 and the source 72 so that the interstitials do not substantially enhance diffusion in the vertical direction is contemplated as falling within the scope of the present invention.

Figure 7:
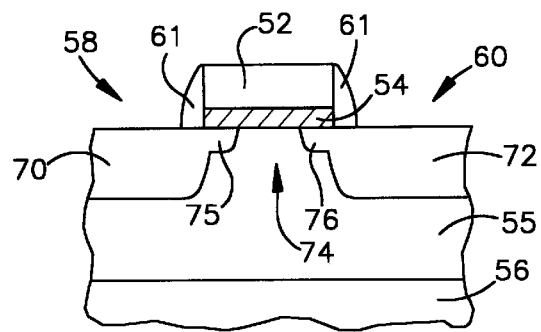
FIG. 7 is a fragmentary cross section diagram illustrating the structure of FIG. 6 after a thermal treatment, thereby illustrating how the enhanced diffusion of the drain region and the source region forms extension regions.

Subsequent to the large tilt angle implant of FIG. 6, an RTA is performed, for example, at about 1,000° C. for about 30 seconds to activate the dopant species and repair the lattice damage caused by the implantations, as illustrated in FIG. 7. Note that the enhanced lateral diffusion due to the interstitials near the lateral edge of the drain 70 and the source 72 cause extension regions 75 and 76 to form under the gate oxide 54 so as to be disposed between the drain 70 and the channel 74 and the source 72 and the channel 74, respectively. Consequently, the extension regions 75 and 76 are formed primarily by enhanced lateral diffusion of the drain 70 and the source 72 without the need for a separate extension region implant which would require an extra mask step. Therefore the present invention substantially simplifies the manufacturing process.

Figure 8:
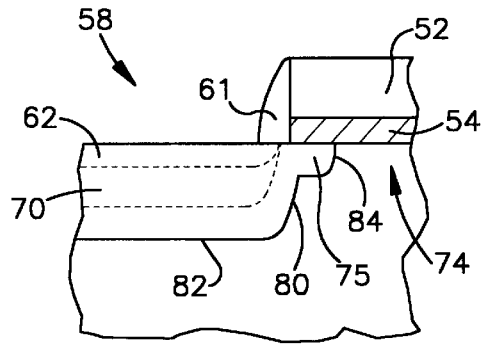
FIG. 8 is an amplified fragmentary cross section diagram of the structure of FIG. 7 illustrating the enhanced lateral diffusion of the drain region according to the present invention.
Figure 9:
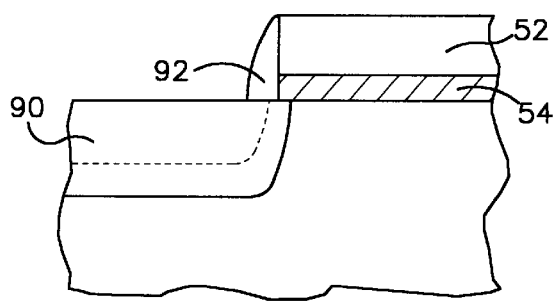
FIG. 9 is an amplified fragmentary cross section diagram illustrating the drain region of a prior art transistor structure.

The RTA causes diffusion of the drain 70 and the source 72 in both the lateral and vertical directions 80 and 82, as illustrated in FIG. 8. The lateral diffusion 80 and the vertical diffusion 82 experience diffusion governed by Fick's law as well as enhanced diffusion of boron due to pairing of boron with silicon interstitials. However, the dopants under the gate 54 are subjected to further lateral enhanced diffusion 84 which is due to the interstitials formed by the large tilt angle implant. The enhanced lateral diffusion 84 is due to the interstitials pairing with the drain impurity dopants (e.g., B/BF$_2$) which accelerate the diffusion. Since the interstitials of the regions 62 are located near the lateral edge of the drain 70 and the source 72, the enhanced diffusion 84 occurs laterally under the gate oxide which forms the extension regions 75 and 76. Likewise, since the interstitials are shallow (i.e., located near the surface) they are not located near the bottom profile of the drain 70 and the source 72. Consequently, the interstitials do not appreciably contribute to the diffusion in the vertical direction.

Therefore the large tilt angle implant generates shallow interstitials which are located near the lateral edge of the drain 70 and the source 72, thereby providing enhanced lateral diffusion and therefore not increasing the junction depth of the drain 70 and the source 72. In addition, the enhanced lateral diffusion creates extension regions 75 and 76 without having to perform a separate LDD dopant implant, thereby eliminating a mask step.

FIG. 8 illustrates the diffusion caused by the RTA, wherein the dotted line illustrates the impurity dopant profile of the drain and the location of the interstitial region 62 prior to the RTA and the solid line represents the completed junction depth profile after the lateral, vertical and enhanced lateral diffusions 80, 82 and 84, respectively.

Figure 10:
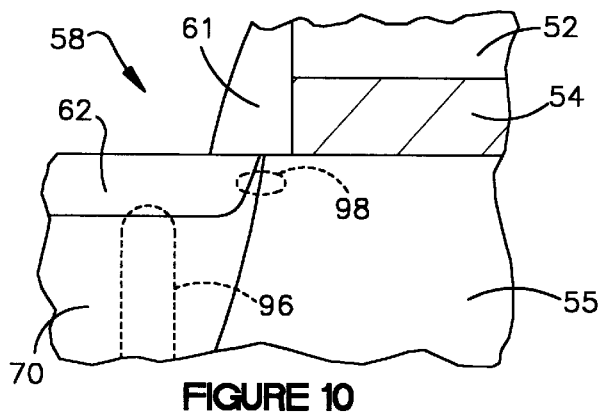
FIG. 10 is an amplified fragmentary cross section diagram illustrating the present invention prior to thermal treatment, wherein the interstitials in the drain region generated by the large tilt angle implant reside near the lateral edge of the drain region.
Figure 11:
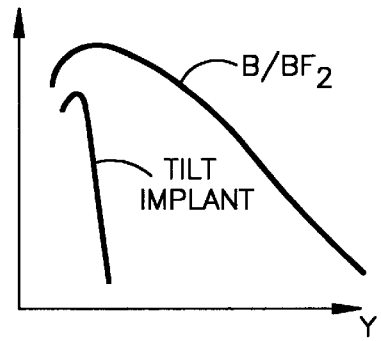
FIG. 11 is a graph illustrating the dopant profile of the drain region and the interstitial profile of the large tilt angle implant in a vertical portion of the drain region of FIG. 10 according to the present invention.
Figure 12:
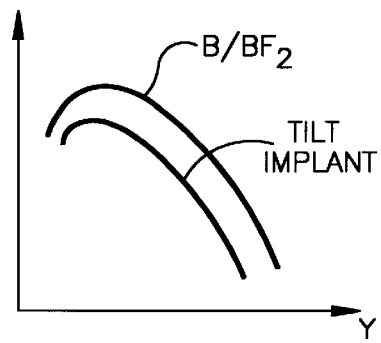
FIG. 12 is a graph illustrating the dopant profile of the drain region and the interstitial profile of the large tilt angle implant at a lateral edge of the drain region of FIG. 10 according to the present invention.

The manner in which the present invention achieves the enhanced lateral diffusion 84 without a substantial change in the vertical diffusion 82 may be better understood in conjunction with FIGS. 10–12. In FIG. 10, the impurity dopant and interstitial profiles of regions 62 and 70 are illustrated in an amplified cross section of the drain region 58 of the transistor 50 near the gate 52 and the gate oxide 54. At a first region 96 (the vertical portion), the interstitial region 62 is substantially more shallow than the drain 70 and consequently the distance between the tails of the interstitial region 62 and the drain 70 are far apart, which is illustrated in greater detail in the concentration profile of FIG. 11. Because of the significant distance between the interstitials and the tail of the drain 70 in the first region 96 the interstitials do not significantly contribute to the vertical diffusion of the drain 70 in the vertical direction. Conversely, in the second region 98 (the lateral portion), the lateral edge of the interstitial region 62 and the drain 70 are substantially coincident, or at least relatively close together. Therefore the lateral tail of the interstitial region 62 and the drain 70 are close together as illustrated in FIG. 12 and the interstitials contribute significantly to the lateral enhanced diffusion 84 of the drain 70. Therefore the interstitial regions 62 enhance the lateral diffusion 84 near the surface of the transistor 50 as illustrated in FIG. 8, thereby generating the extension regions 75 and 76 without increasing the drain junction depth.

According to another embodiment of the invention, the method described above can be modified to fully decouple the formation of the extension regions 75 and 76 and the activation of the impurity dopants in the drain 70 and the source 72. In such a process, the spacer formation and the source/drain implant proceeds as described above in conjunction with FIGS. 4 and 5. Subsequently, a high temperature anneal is performed (e.g., a temperature of about 1,000° C. for about 30 seconds). The high temperature anneal activates the heavily doped source and drain impurities.

After the high temperature anneal, the sub-amorphous large tilt angle implant is performed according to the description above in conjunction with FIG. 6, thereby placing the interstitials at the desired location. Subsequently, a lower temperature anneal is then used to controllably drive the dopants in the lateral direction to form the extension regions 75 and 76. Because of the lower temperature of the second anneal (e.g., a temperature of about 900° C. for about 30 seconds) the formation of the extension regions 75 and 76 may be governed solely by the large tilt angle parameters such as the tilt angle θ, the dose of the implant and the implantation energy. The extent to which the extension regions 75 and 76 diffuse laterally below the gate oxide 54 may further be controlled via the temperature and duration of the low temperature anneal as well as the width of the sidewall spacers 61. By decoupling the activation of the source/drain regions from the formation of the extension regions 75 and 76 via enhanced lateral diffusion, one may further control the extension regions 75 and 76 without impacting the depth of the source and drain junctions, respectively.

Controlling the extent to which the extension regions 75 and 76 extend below the gate oxide 54 is advantageous because designers often wish to trade off transistor switching speed and drive current. As is well known by those skilled inn the art, the extent to which the drain extension region 75 extends beneath the gate oxide 54 influences the gate-to-drain overlap capacitance $C_{gdo}$. As the drain extension region 75 extends further into the channel 74, $C_{gdo}$ increases, which slows the switching speed of the transistor since the increased capacitance makes discharging the gate take a longer period of time. On the other hand, the further the drain extension region 75 extends into the channel 74, the effective channel length of the structure is reduced which improves the transistor drive current. Consequently, a transistor structure designer may wish to customize the extent to which the drain extension region 75 extends beneath the gate oxide 54 in order to achieve a desired balance between the transistor switching speed and the drive current. Furthermore, the present invention provides for the customization of the drain-to-gate capacitance and the source/drain resistance for optimum transistor performance without impacting the depth of the source/drain junctions, thereby protecting the device from undesirable hot-carrier effects.

According to another embodiment of the present invention, the step of performing the sub-amorphous large tilt angle implant may occur prior to the source/drain implant. One advantage of performing the large tilt angle implant first is that when the source/drain implant is subsequently performed, the drain 70 and the source 72 junctions may be more shallow since the sub-amorphous implant creates enough damage near the surface of the N-well region 55 to thereby reduce channeling. Therefore using the large tilt angle as a pre-implant may aid in making the vertical junction doping profile more steep.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a lightly doped drain transistor, comprising the steps of:
    forming a gate electrode and a gate oxide over a semiconductor substrate;
    forming a drain in a drain region and a source in a source region of the substrate;
    implanting the drain region and the source region of the substrate with a sub-amorphous large tilt angle implant, thereby supplying interstitials at a location near the gate oxide; and
    thermally treating the substrate, wherein the interstitials enhance a lateral diffusion of the drain under the gate oxide without substantially impacting a vertical diffusion of the drain, wherein the enhanced lateral diffusion forms a lightly doped drain extension region and a lightly doped source extension region without an increase in a junction depth of the drain and the source.

2. The method of claim 1, wherein the tilt angle is in the range of about 30–60°.

3. The method of claim 1, wherein the step of forming the drain and the source precedes the step of implanting the drain region and the source region with the large tilt angle implant.

4. The method of claim 1, wherein the step of implanting the drain region and the source region with the large tilt angle implant comprises implanting one of silicon, germanium or indium.

5. The method of claim 1, wherein the step of implanting the drain region and the source region with the large tilt angle implant comprises implanting a sub-amorphous dose into the drain region.

6. The method of claim 1, wherein a dose of the large tilt angle implant is about 10–30 percent of an amorphizing dose.

7. The method of claim 1, wherein the step of thermally treating the substrate comprises performing a rapid thermal anneal.

8. The method of claim 7, wherein performing the rapid thermal anneal comprises subjecting the substrate to a temperature of about 1,000° C. for about 10–30 seconds.

9. The method of claim 1, wherein a composite doping and interstitial profile near the gate oxide prior to the thermal treatment comprises interstitials near a lateral edge of a drain dopant profile and a source dopant profile, thereby resulting in an enhanced lateral diffusion under the gate oxide.

10. The method of claim 1, further comprising the step of forming the sidewall spacers on side portions of the gate and the gate oxide before the forming of the drain and the source.

11. The method of claim 1, wherein the step of forming the drain and the source comprises:
    implanting $BF_2$ dopants in the drain region and the source region, respectively; and
    performing a high temperature anneal before performing the large tilt angle implant, thereby activating the dopants.

12. The method of claim 11, wherein the high temperature anneal is performed at a temperature of about 1,000° C. for about 10–30 seconds.

13. The method of claim 11, wherein the step of thermally treating the substrate comprises performing a low temperature anneal which enhances the lateral diffusion of the drain due to the interstitials without substantially impacting a vertical diffusion of the drain and the source, respectively.

14. The method of claim 13, wherein performing a low temperature anneal comprises subjecting the substrate to a temperature of about 900° C. for about 30 seconds.

15. A method of making a lightly doped drain transistor, comprising the steps of:
    forming a gate electrode and a gate oxide over a semiconductor substrate;
    forming a drain in a drain region and a source in a source region of the substrate;
    generating interstitials near a lateral edge of at least one of the drain and the source; and
    thermally treating the substrate, wherein the interstitials enhance a lateral diffusion of the at least one of the drain and the source under the gate oxide without substantially impacting a vertical diffusion of the drain or the source, wherein the enhanced lateral diffusion forms at least one of a lightly doped drain extension region and a lightly doped source extension region without an increase in a junction depth of the drain and the source.

16. The method of claim 15, wherein generating the interstitials comprises implanting at least one of the drain and the source of the substrate with a sub-amorphous large tilt angle implant, thereby supplying creating the interstitials at a location near the gate oxide.

17. The method of claim 16, wherein the step of implanting at least one of the drain and the source with the large tilt angle implant comprises implanting one of silicon, germanium or indium.

18. The method of claim 16, wherein the step of implanting at least one of the drain and the source with the large tilt angle implant comprises implanting a sub-amorphous dose into the drain region.

* * * * *

UNITED STATES PATENT AND TRADEMARK OFFICE
CERTIFICATE OF CORRECTION

PATENT NO.: 6,008,099

DATED: December 28, 1999

INVENTOR(S): Akif Sultan and Dong-Hyuk Ju

It is certified that error appears in the above-identified patent and that said Letters Patent is hereby corrected as shown below:

In column 3, lines 60-63, description of FIG. 11 should read as follows:

> FIG. 11 is a graph illustrating the dopant profile of the drain region and the interstitial profile of the large tilt angle implant in a vertical portion of the drain region of FIG. 10 according to the present invention; and In column 6, line 37, "$3 \times 10^3$" should read --$3 \times 10^{13}$--.

In column 8, line 52, please replace the word "inn" with --in--.

Signed and Sealed this

Eighth Day of August, 2000

Attest:

Q. TODD DICKINSON

*Attesting Officer*     Director of Patents and Trademarks